(12) United States Patent
Lee

(10) Patent No.: US 10,916,652 B2
(45) Date of Patent: Feb. 9, 2021

(54) ASYMMETRIC TRANSISTORS AND RELATED DEVICES AND METHODS

(71) Applicant: INTEL CORPORATION, Santa Clara, CA (US)

(72) Inventor: Yen Chun Lee, Albuqerque, NM (US)

(73) Assignee: Intel Corporation, Santa Clara, CA (US)

( * ) Notice: Subject to any disclaimer, the term of this patent is extended or adjusted under 35 U.S.C. 154(b) by 17 days.

(21) Appl. No.: 16/349,210

(22) PCT Filed: Dec. 28, 2016

(86) PCT No.: PCT/US2016/068815
§ 371 (c)(1),
(2) Date: May 10, 2019

(87) PCT Pub. No.: WO2018/125074
PCT Pub. Date: Jul. 5, 2018

(65) Prior Publication Data
US 2020/0194588 A1    Jun. 18, 2020

(51) Int. Cl.
*H01L 29/06* (2006.01)
*H01L 29/78* (2006.01)
*G11C 13/00* (2006.01)
*H01L 21/8234* (2006.01)
*H01L 27/24* (2006.01)
(Continued)

(52) U.S. Cl.
CPC ...... *H01L 29/7833* (2013.01); *G11C 13/0004* (2013.01); *H01L 21/823412* (2013.01); *H01L 27/2436* (2013.01); *H01L 29/0615* (2013.01); *H01L 29/0873* (2013.01); *H01L 29/6659* (2013.01); *H01L 45/1206* (2013.01)

(58) Field of Classification Search
CPC ............ H01L 29/0615; H01L 29/0847; H01L 29/0873; H01L 29/1045; H01L 29/6659; H01L 29/66659; H01L 29/7833; H01L 45/1206
USPC .......................................................... 257/4
See application file for complete search history.

(56) References Cited

U.S. PATENT DOCUMENTS 5,153,683 A   10/1992  Noda
5,970,353 A   10/1999  Sultan
(Continued)

OTHER PUBLICATIONS

PCT/US2016/068815, International Search Report and Written Opinion, dated Aug. 30, 2017, 12 pages.

*Primary Examiner* — Long K Tran
(74) *Attorney, Agent, or Firm* — Schwabe, Williamson & Wyatt, P.C.

(57) ABSTRACT

Asymmetric transistors and related methods and devices are disclosed. A transistor includes a semiconductor material doped with a first type of charge carriers along the gate oxide according to an asymmetric doping profile with a halo region on a source side. The transistor also includes a source including a lightly doped drain (LDD) on the source side, and a drain having a doping profile of charge carriers of a second type graded in a decreasing manner toward the source side. A method includes applying a large angle tilt implant drain (LATID) process to a drain side, a halo implant process to a source side, and applying an LDD process on the source side. A memory device includes an asymmetric transistor. A computing device includes an asymmetric transistor.

7 Claims, 10 Drawing Sheets

(51) Int. Cl.
*H01L 29/08* (2006.01)
*H01L 29/66* (2006.01)
*H01L 45/00* (2006.01)

(56) References Cited

U.S. PATENT DOCUMENTS

| | | | |
|---|---|---|---|
| 6,207,995 B1 * | 3/2001 | Gardner | H01L 21/28194 257/344 |
| 2006/0043430 A1 | 3/2006 | Feudel et al. | |
| 2006/0054971 A1 | 3/2006 | Keshavarzi et al. | |
| 2011/0248347 A1 * | 10/2011 | Benaissa | H01L 21/82341 257/368 |
| 2015/0034909 A1 * | 2/2015 | Horch | H01L 27/11519 257/39 |

* cited by examiner

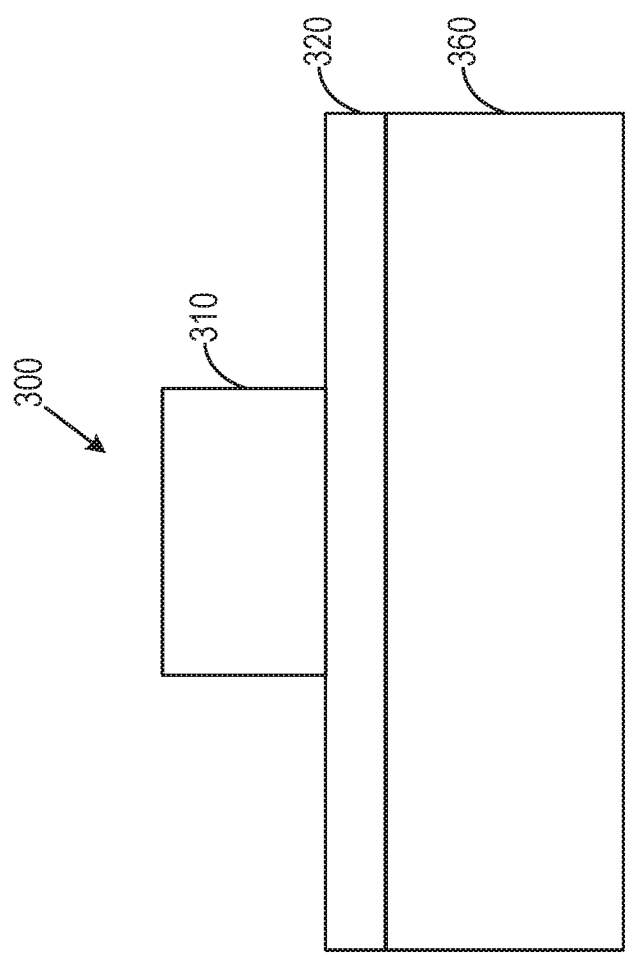

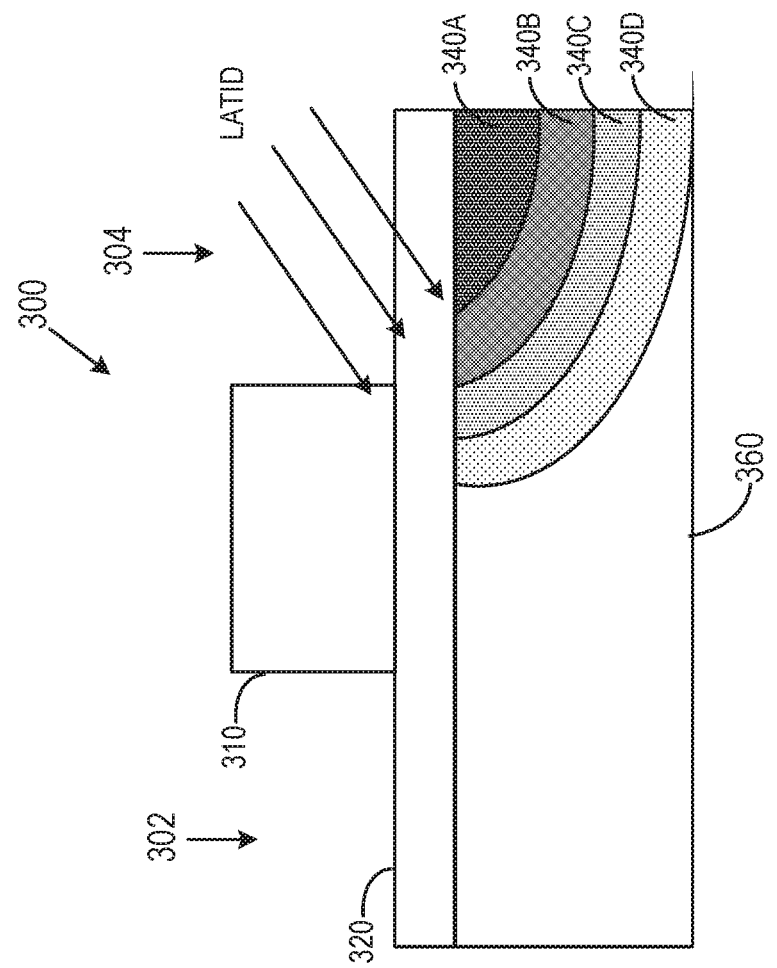

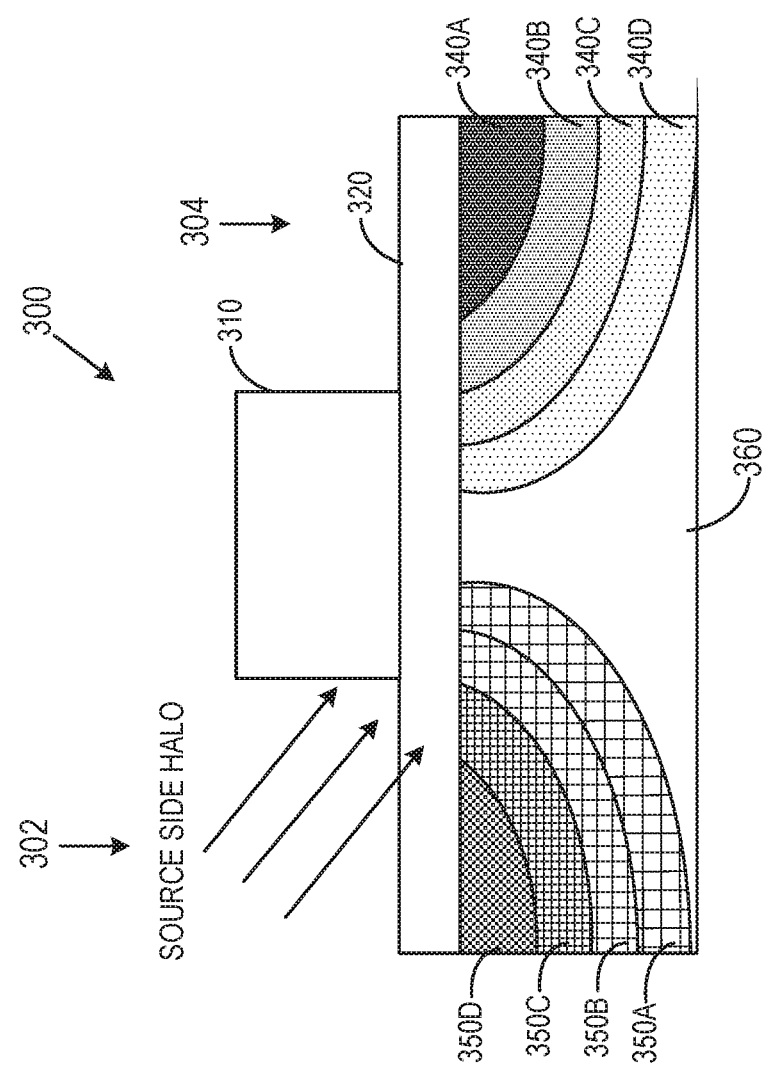

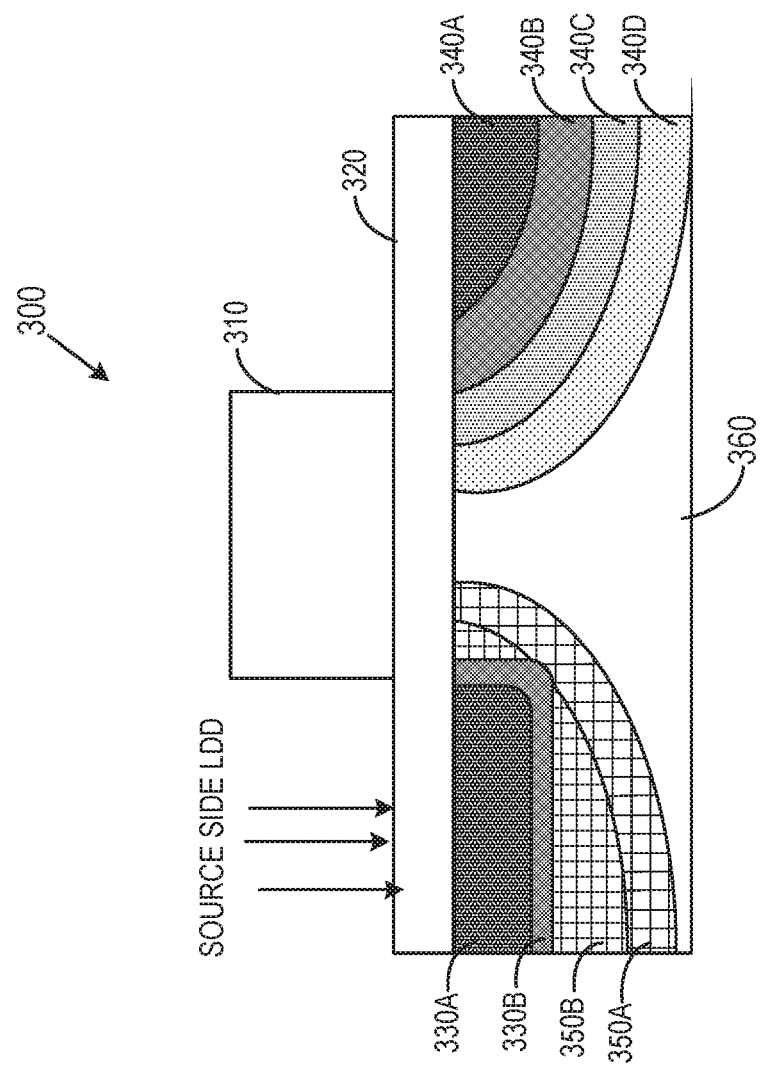

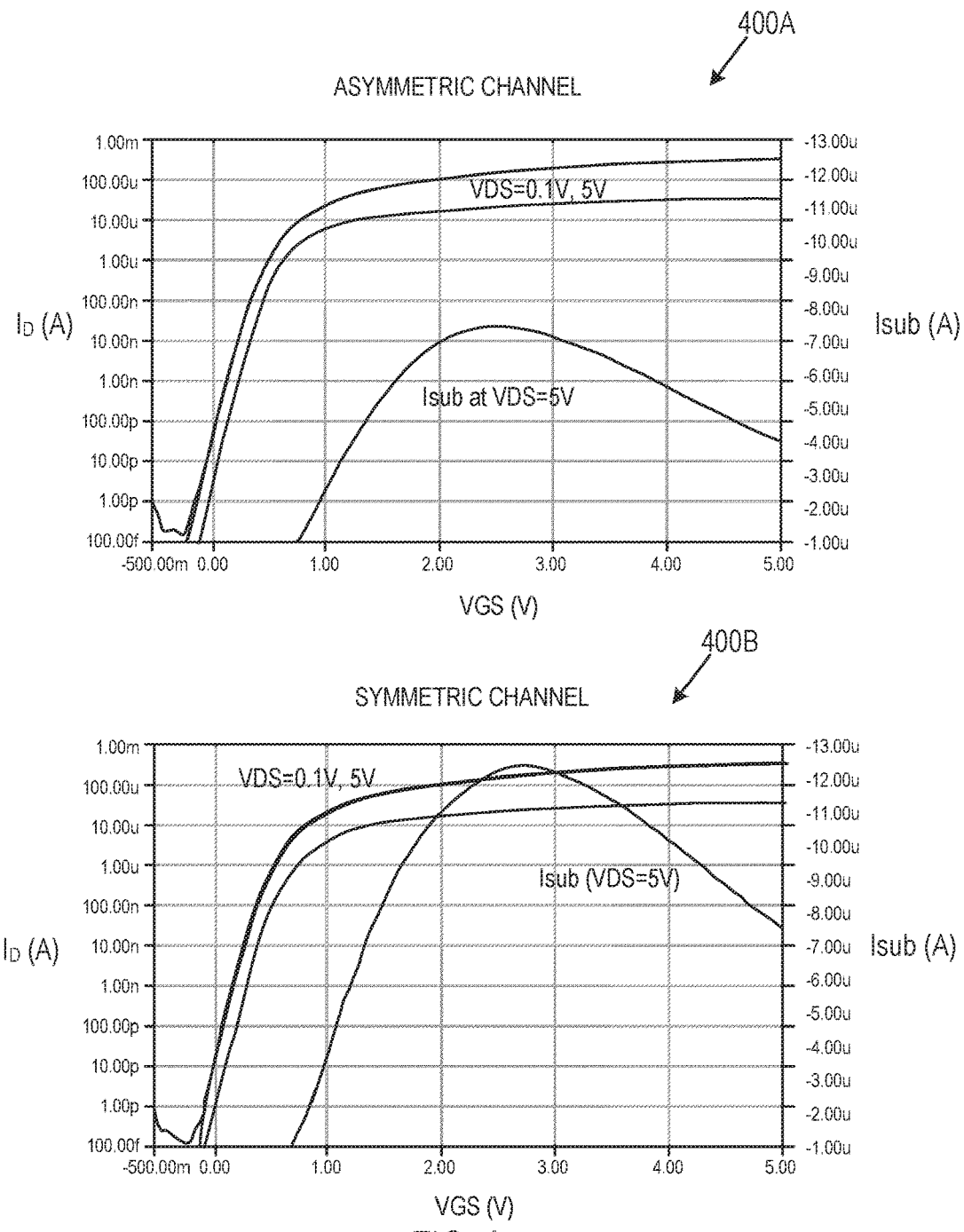
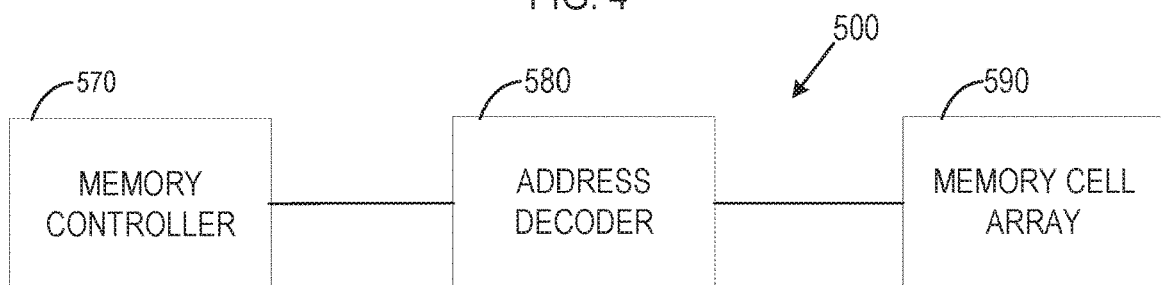
FIG. 4
FIG. 5

ASYMMETRIC TRANSISTORS AND RELATED DEVICES AND METHODS

RELATED APPLICATION(S)

This application is a national stage filing under 35 U.S.C. § 371 of International Patent Application No. PCT/US2016/068815, filed Dec. 28, 2016, which is hereby incorporated by reference herein in its entirety.

BACKGROUND

Transistors are used in a variety of electrical applications. For example, transistors are often used as an electrically controlled switch. A specific application that uses transistors is a memory address decoder. Address decoders receive memory address data and provide corresponding device selection signals.

As transistors are scaled to be smaller as the demand for high-density devices increases, performance of these scaled transistors tends to deviate from ideal models known in the art. This trend effects operation and performance of device including these scaled transistors, such as memory address decoders.

BRIEF DESCRIPTION OF THE DRAWINGS

FIGS. 3A-3D are simplified cross-sectional views of an example semiconductor device that can be manufactured using the method of FIG. 2.

FIG. 4 is a simplified illustration of plots indicating drain currents and substrate currents plotted against gate to source voltage for an asymmetric transistor, and a symmetric transistor.

FIG. 5 is a simplified block diagram of a memory device, according to some embodiments.

DETAILED DESCRIPTION

Figure 1:
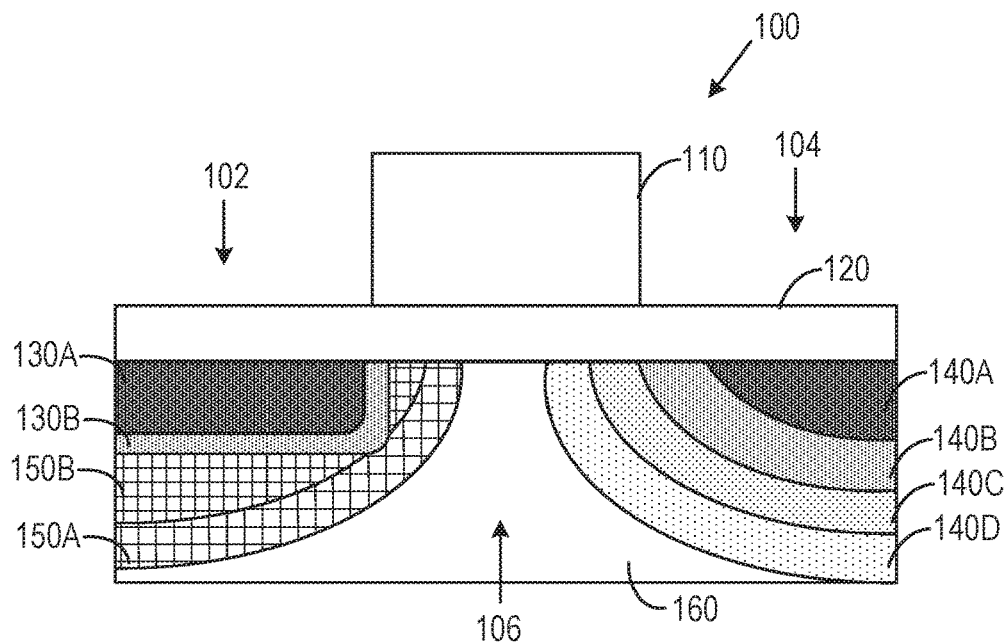
FIG. 1 is a simplified cross-sectional view of an asymmetric transistor, according to some embodiments.

Disclosed herein are asymmetric transistors, and related devices and methods. In the following description, various aspects of the illustrative implementations will be described using terms commonly employed by those skilled in the art to convey the substance of their work to others skilled in the art. However, it will be apparent to those skilled in the art that the disclosure may be practiced with only some of the described aspects. For purposes of explanation, specific numbers, materials and configurations are set forth in order to provide a thorough understanding of the illustrative implementations. It will be apparent to one skilled in the art, however, that the disclosure may be practiced without the specific details. In other instances, well-known features are omitted or simplified in order not to obscure the illustrative implementations.

Various operations will be described as multiple discrete operations, in turn, in a manner that is most helpful in understanding the disclosure. The order in which the operations are presented in the description, however, should not be construed to imply that these operations are necessarily order dependent. In particular, these operations need not be performed in the order of presentation. Rather, in some embodiments, the order may be modified.

The terms "over," "under," "between," and "on," as used herein, refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers. Furthermore, As used herein, the term "conductive" refers to electrically conductive.

Implementations of the disclosure may be formed or carried out on a substrate, such as a semiconductor substrate. In one implementation, the semiconductor substrate may be a crystalline substrate formed using a bulk silicon or a silicon-on-insulator (SOI) substructure (e.g., silicon-on-glass (SOG), silicon-on-sapphire (SOS), etc.). In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although implementations described herein may refer to planar transistors, it should be noted that the implementations may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may include at least one P-type workfunction metal or N-type workfunction metal, depending on whether the transistor is to be a PMOS or an NMOS transistor. In some implementations, the gate electrode layer may include of a stack of two or more metal layers, where one or more metal layers are workfunction metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, when viewed as a cross-section of the transistor along the source-channel-drain direction, the gate electrode may include a "U-shaped" structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may include one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. In further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

The ILD layers may also include conductive interlayer structures formed therethrough to provide conductive interfaces between regions separated by the ILD layers. The conductive interfaces may be protected by barrier/liner materials. As critical dimensions of these conductive interlayer structures descend below 20 nanometers (nm), the barrier/liner materials needed for adhesion and or diffusion barrier properties occupies an increasingly large percentage of the available conducting volume. As a result, a low resistivity, ultrathin material is desirable.

In designing transistors (e.g., N-type field effect transistors (NFETs)) for address decoders, it is desirable that the transistors be small, operate at high voltage, have high output resistance, have high transconductance, and have minimal body effect. Regarding transistors being small, in order to avoid die size penalty from the decoder array, non-self-aligned processes that drastically alter the transistor structure are not feasible or are cost-prohibitive.

Regarding transistors operating at high voltage, a memory element can have threshold voltage and holding voltage from nine volts (9V) to two volts (2V). A small holding current of twenty micro amps (20 µA) is applied to maintain selection. Accordingly, a large drain to source voltage (VDS) (e.g., about 5V) will be dropped while only a small gate overdrive is applied on the decoder. Such operation increases the peak electric field at the drain and impact ionization.

Regarding transistors having high output impedance ($1/g_{ds}$), to mitigate the spike current during threshold switches, the decoder should provide high impedance isolation to minimize peripheral capacitance. The high electric field at the drain degrades $1/g_{ds}$ and the impedance isolation due to short channel effects.

Regarding high transconductance ($G_m$), during reset current delivery of 150 µA, the voltage drop across the array path resistance is significantly different depending on the electrical distance on the target cell. In order for a current mirror to maintain control of the current delivery, the output node of the mirror needs to be supplied with sufficient voltage to keep the mirror transistor in saturation mode. Due to a high array path resistance of the far cell, the voltage drop across the array path and the decoders combined often consume too much supply voltage. Accordingly, the current mirror is pushed into a linear mode, causing inadequate current delivery. A decoder with high transconductance will minimize the drain to source voltage ($V_{DS}$) that is consumed by the decoder. As a result, current delivery capability of the current mirror to the far cells is extended. The near cells represent the other end of extremes where the array path resistance is minimal. The lack of voltage drop across the array path means the supply voltage is spread mostly between the decoder $V_{DS}$ and the mirror. When the $V_{DS}$ stress on the decoder is too large, impact ionization increases exponentially, which allows more drain current to flow to the cell than is intended to be controlled at the source side by the current mirror. A decoder with high transconductance is less likely to exert such high $V_{DS}$ stress to meet the current delivery demand from the mirror, therefore delaying the onset of impact ionization and maintaining adequate current delivery for the near cells.

Regarding minimal body effect of transistors, since the source side of a decoder is not connected to the transistor body, current delivery capability is degraded by body effect. Some conventional ways to mitigate drain peak electric field include Drain-Extended MOSFET (DEMOS) and Large Angle Tilt Implanted Drain (LATID). In DEMOS processes, the drift region is extended, but the process is complex and costly, and results in relatively large device features. In LATID processes, the channel under the gate is counter-doped to create a sooth gradient lateral dopant profile between the channel and the source/drain. LATID, however, lowers threshold voltage of a transistor and aggravates short channel effects.

It is relatively easy to identify desirable characteristics of a transistor used in an address decoder. It is often much more difficult to design transistors having these desirable characteristics. Disclosed herein are transistors demonstrating some of these desirable characteristics, and related devices and methods. These transistors have asymmetric dopant profiles where dopant density is relatively low at the drain, and the dopant density is relatively high at the source, and methods of forming such transistors. Peak electric field at the transistor drain (which causes impact ionization) is lowered through reducing local charge density and increasing the drift distance according to the Poisson equation. Short channel effects and transconductance are improved by increasing the dopant density at the virtual source, which also provides shielding against the drain field penetration reaching the source. With a high dopant density at the virtual source, inject velocity is increased for a given drain to source voltage ($V_{DS}$), and $G_m$ is therefore improved. LATID is used only on the drain side to lower the local charge density through counter doping. To prevent LATID from lowering the threshold voltage ($V_T$), the total depletion charge, capacitively coupled to the gate, should not be changed. The relatively low dopant density at the drain may be accomplished through aggressive drain side LATID. A relatively high dopant density at the source may be accomplished through source side Lightly Doped Drain (LDD) processes and Halo implants.

In some embodiments, a transistor includes a gate including electrically conductive material, and semiconductor material separated from the gate by a gate oxide. The semiconductor material is doped with a first type of charge carriers along the gate oxide according to an asymmetric doping profile with a halo region doped with halo density on a source side of the semiconductor material and a doping density lower than the halo density elsewhere. The semiconductor material includes a source including a lightly doped drain (LDD) region on the source side. The source is doped with a second type of charge carriers with a source density. The semiconductor material also includes a drain doped with the second type of charge carriers on a drain side of the semiconductor material. A drain doping profile of the drain is graded from a drain density on the drain side and decreasing past an outer wall of the gate toward the source side along the gate oxide.

In some embodiments, a method of manufacturing a semiconductor device includes applying a large angle tilt implant drain (LATID) process to semiconductor material on a drain side of a transistor gate to produce a drain. The method also includes applying a halo implant process to the semiconductor material on a source side of the transistor gate to form a source-side halo. The method further includes applying a lightly doped drain (LDD) process to the source side of the semiconductor material to form a source.

In some embodiments, a memory device includes an array of memory cells, and at least one address decoder operably coupled to the array of memory cells. The at least one address decoder includes at least one transistor. The at least one transistor includes a source, a drain, and a channel region. The source includes low density drain (LDD) implants. The drain includes large angle tilt drain (LATID) implants. The channel region has an asymmetric doping profile with a higher doping density proximate to the source than a doping density of the channel region near the drain.

In some embodiments, a computing device includes an asymmetric transistor. The Asymmetric transistor includes a drain, a source, and an asymmetrically doped channel region between the drain and the source. The asymmetrically doped channel region includes a source side and a drain side. At least a portion of the source side is doped with a higher doping concentration than the remainder of the asymmetrically doped channel region. The at least a portion of the source side forms an abrupt junction with the source. The drain side demonstrates a graded doping profile resulting from a LATID implant process used to form the source.

FIG. 1 is a simplified cross-sectional view of an asymmetric transistor 100 ("transistor" 100), according to some embodiments. The transistor 100 includes a gate 100 including electrically conductive material (e.g., aluminum, tungsten, a silicide, polysilicon, other conductive materials, etc.), a gate oxide 120 including electrically insulating material (e.g., silicon dioxide, silicon nitride, a high-k dielectric material, other electrically insulating materials, etc.), and a semiconductor material 160 separated from the gate 110 by the gate oxide 120.

The semiconductor material 160 is doped with a first type of charge carriers (e.g., electron holes (or simply "holes"), or electrons) along the gate oxide 120 according to an asymmetric doping profile. Specifically, the semiconductor material 160 includes a halo region 150A, 150B (sometimes referred to herein together as "halo region" 150) doped with a halo density (a relatively high doping density) on a source side 102 of the semiconductor material. The doping density of the first type of charge carriers in the semiconductor material 160 outside of the halo region 150 may be lower than the halo density. In FIG. 1, the halo region 150 is separated into multiple sub-regions 150A, 150B to indicate the at least slightly graded doping density profiles of halo regions in general. In other words, the sub-regions 150A and 150B are divided by different ranges of carrier densities of the first type of charge carriers.

The semiconductor material 160 also includes a source 130A, 130B (sometimes referred to herein together as "source" 130) comprising a lightly doped drain (LDD) region on the source side 102 of the semiconductor material 160. The source 130 is doped with a second type of charge carriers (e.g., electrons if the first type of charge carriers is holes, or holes if the first type of charge carriers is electrons). A source density of the second type of charge carriers in the source 130 may be at least slightly graded (indicated in FIG. 1 by sub-regions 130A, 130B of the source 130 indicating different ranges of carrier densities). As a result of LDD implants of the source 130, the source side 102 includes a relatively shallow source, and a relatively abrupt junction between the relatively highly doped halo region 150 and the source 130. This abrupt junction may increase a resiliency of the transistor 100 to short channel effects.

The semiconductor material 160 further includes a drain 140A, 140B, 140C, 140D (sometimes referred to together as "drain" 140) on a drain side 104 of the semiconductor material 160. The drain 140 is doped with the second type of charge carriers (i.e., the same type of charge carriers as those of the source 130). A doping profile of the drain 140 is graded relatively gradually from a drain density in a first sub-region 140A of the drain 140 on the drain side and decreasing past an outer wall of the gate toward the source side along the gate oxide (the graded profile indicated by sub-regions 140A, 140B, 140C, and 140D of the drain 140). The drain 140 extends at least partially under the gate 110. In some embodiments, the drain 140 includes a large angle tilt implant drain (LATID). Accordingly, the doping profile of the second type of charge carriers is much more gradual on the drain side 104 than on the source side 102 due to the LATID implants on the drain side 104. In some embodiments, the drain density of the second type of charge carriers in the sub-region 140A of the drain 140 may be lower than the source density of second type of charge carriers in the sub-region 130A of the source 130.

In some embodiments, the LATID process used to form the drain 140 may be a rather aggressive LATID process. For example, a relatively high energy LATID implantation may be used (but not high enough energy to penetrate the gate stack). Also, a relatively high angle LATID process may be used (e.g. 30°-40°). The result may be a gradual doping profile of the second type of charge carriers on the drain side 104.

A channel region 106 of the semiconductor material 160 between the source 130 and the drain 140 has an asymmetric doping profile with a higher doping density of the first type of charge carriers proximate to the source 130 than a doping density of the first type of charge carriers near the drain 140. Also, as previously discussed, semiconductor material 160 has a more abrupt doping profile of the second type of charge carriers near the source 130 than the doping profile of the second type of charge carriers near the drain 140. Several benefits may result from this asymmetry. For example, impact ionization may be decreased without substantially reducing the threshold voltage (the abrupt junction on the source side 102 mitigates threshold voltage lowering effects resulting from the LATID implants of the source 140). Also, the asymmetry may result in reduced drain induced barrier lowering (DIBL) (a short channel effect). The asymmetry may further decrease body effect of the transistor 100. A decreased body effect may be advantageous in situations where the source 130 is operably coupled to a first electrical line configured to operate at a voltage potential that is different from a voltage potential of a second electrical line operably coupled to a body of the transistor 100.

LATID in general may cause a decrease in threshold voltage of a transistor, and aggravated short channel effects, especially in devices formed using symmetric LATID processes (e.g., LATID on both the source side and the drain side). Due to the asymmetry of the transistor 100 and the abrupt junction between the halo region 150 and the source 130, however, the transitory 100 may not demonstrate a reduced threshold voltage or demonstrate aggravated short channel effects. Also, impact ionization may be reduced by about fifty percent (50%) as compared to symmetric transistors. Furthermore, transconductance, linear drain current, and body effect ($C_{BODY}/C_{GATE}$) may be improved by about fifteen percent (15%).

In some embodiments, the transistor 100 includes an N-type MOSFET (NMOS) transistor. In such embodiments, the first type of charge carriers includes holes and the second type of charge carriers includes electrons. In some embodiments, the transistor 100 includes a P-type MOSFET (PMOS) transistor. In such embodiments, the first type of charge carriers includes electrons, and the second type of charge carriers includes holes.

Figure 2:
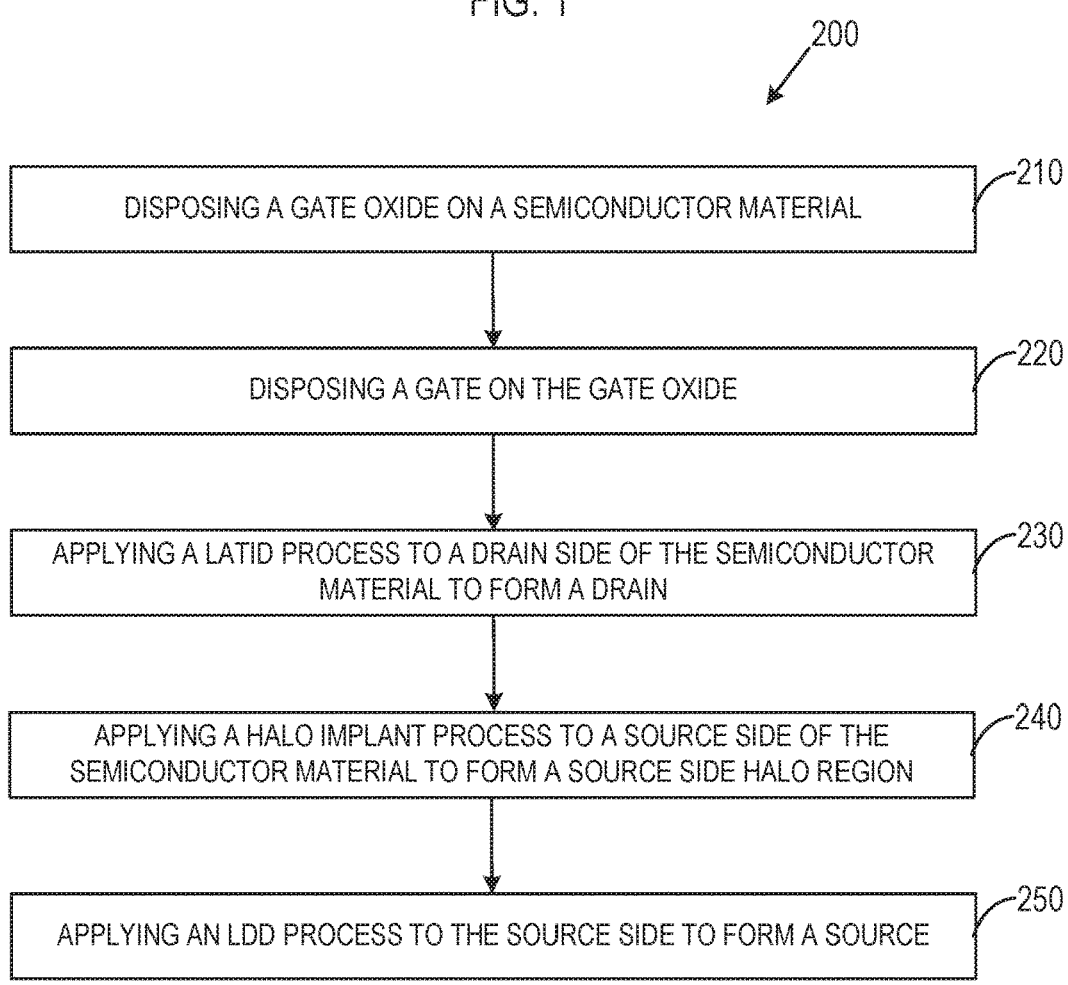
FIG. 2 is a simplified flowchart illustrating a method of manufacturing a semiconductor device (e.g., the asymmetric transistor of FIG. 1), according to some embodiments.

FIG. 2 is a simplified flowchart illustrating a method 200 of manufacturing a semiconductor device (e.g., the transistor 100 of FIG. 1), according to some embodiments.

FIGS. 3A-3D are simplified cross-sectional views of an example semiconductor device 300 that can be manufactured using the method 200 of FIG. 2A.

Referring to FIGS. 2 and 3A together, the method 200 includes disposing 210 a gate oxide 320 on a semiconductor material 360. The gate oxide 320 and the semicondcutor material 360 may be similar to the gate oxide 120 and the semiconductor material 160 discussed above with reference to FIG. 1. For example the semiconductor material 360 may include a lightly doped semiconductor material (e.g., lightly doped with a first type of charge carriers). Disposing 210 a gate oxide 320 may include any method known in the art (e.g., oxidizing material on the surface of the semiconductor material 360, growing insulating material on the surface of the semiconductor material 360, etc.).

The method 200 also includes disposing 220 a gate 310 on the gate oxide 320. The gate 310 may be similar to the gate 110 discussed above with reference to FIG. 1. Disposing 220 a gate 310 may be performed using any method known in the art (e.g., plating, deposition, etc.). In some embodiments, disposing 220 a gate 310 includes disposing a gate material (e.g., a metal, a doped semiconductor, etc.) on the gate oxide 320 and etching the gate material to form the gate 310.

Referring to FIGS. 2 and 3B together, the method 200 further includes applying 230 a LATID process to the semiconductor material 360 on a drain side 304 of the semiconductor material 360. The LATID process may result in a drain 340A, 340B, 340C, 340D (sometimes referred to as "drain" 340) having a graded doping profile of a second type of charge carriers on the drain side 304 of the semiconductor material 360. Sub-regions 340A, 340B, 340C, 340D indicate the graded doping profile. The drain 340 is similar to the drain 140 discussed above with reference to FIG. 1. In some embodiments, applying 230 a LATID process includes applying a high energy implant LATID process. In some embodiments, applying 230 a LATID process includes applying a LATID process with an angle of about thirty degrees (30°) to forty degrees (40°). In some embodiments, applying 230 a LATID process includes applying a high-angle LATID process. In some embodiments, applying 230 a LATID process includes applying a LATID process using an n-type dopant such as P31 (e.g., at four different rotations). In some embodiments, applying 230 a LATID process includes applying the LATID process to the drain side 304 while a source side 302 is protected by resist (e.g., photoresist).

Referring to FIGS. 2 and 3C together, the method 200 includes applying 240 a halo implant process to the semiconductor material 360 on the source side 302 of the gate 310 to form a halo region 350A, 350B, 350C, 350D (sometimes referred to together as "halo region" 350) on the sources side 302. The halo region 350 is similar to the halo region 150 discussed above with reference to FIG. 1. Sub-regions 350A, 350B, 350C, 350D indicate the graded doping profile of charge carriers of the first type (e.g., holes for an NMOS device). In some embodiments, applying 240 a halo implant process includes applying the halo implant process while the drain side 304 is protected by resist (e.g., photoresist).

Referring to FIGS. 2 and 3D together, the method 200 also includes applying 250 a lightly doped drain (LDD) process to the source side 302 of the semiconductor material 360 to form a source 330A, 330B (sometimes referred to herein as "source" 330) (e.g., a shallow source of charge carriers of the second type). The source 330 is similar to the source 130 discussed above with reference to FIG. 1. In some embodiments, applying 250 an LDD includes applying the LDD process while the drain side 304 is protected by resist (e.g., photoresist).

The structure of the semiconductor device 300 of FIG. 3D is similar to that of the transistor 100 discussed with reference to FIG. 1. Accordingly, the method 200 of FIG. 2 may be used to manufacture the transistor 100 of FIG. 1. It should be understood that the transistor 100 may instead be manufactured using other methods or processes.

It should be noted that the method 200 may be performed by only adding one additional mask layer and an implant operation, as compared to conventional transistor manufacturing methods. As a result, the cost and complexity of the method 200 is not greatly higher than conventional transistor manufacturing methods. Also, the method 200 does not result in an increased physical gate length or footprint as compared to those of conventional methods, such as DEMOS processes or other methods that increase a layout footprint or process complexity.

FIG. 4 is a simplified illustration of plots 400A, 400B indicating drain currents ($I_D$) and substrate currents (Isub) plotted against gate to source voltage (VGS) for an asymmetric transistor and a symmetric transistor, respectively. The plots 400A, 400B are labeled "ASYMMETRIC CHANNEL" and "SYMMETRIC CHANNEL," respectively. The plot 400A represents estimated performance for asymmetric transistors (e.g., the asymmetric transistor of FIG. 1), as disclosed herein. The plot 400B represents estimated performance for transistors manufactured using both source side and drain side LATID (symmetric transistors). On the left hand side of the plots 400A, 400B, the scale for the drain current (in Amperes) is shown. On the right hand side of the plots 400A, 400B, the scale for the substrate current Isub is shown. The drain currents are labeled "VDS=0.1V, 5V," and the substrate currents are labeled "Isub (VDS=5V)." Two separate drain currents are shown for each plot 400A, 400B, one for a drain to source voltage (VDS) of 0.1 volts, and one for a VDS of 5 volts. The substrate current Isub for each plot 400A, 400B is shown for a VDS of 5V.

A peak of the substrate Isub of plot 400A is located at around VGS=0.5*VDS (where * is the multiplication operator). The plot 400A indicates relatively low impact ionization as compared to the plot 400B. About 50% reduction in substrate current Isub is demonstrated in plot 400A, as compared to the substrate current Isub of plot 400B. This reduction in substrate current Isub may result from a lower peak electric field near the drain as compared to that of the symmetric device corresponding to plot 400B.

As can also be seen, the off state drain currents are similar in both plots 400A, 400B. As a result, the asymmetric transistor 100 has about the same threshold voltage as the symmetric transistor corresponding to plot 400B. As a result, it is observed that the impact ionization of the asymmetric transistor is reduced without changing the threshold voltage, as compared to symmetric transistors.

FIG. 5 is a simplified block diagram of a memory device 500, according to some embodiments. The memory device 500 includes an address decoder 580 operably coupled to a memory controller 570 and a memory cell array 590. The address decoder is configured to receive address bits from the memory controller 570, and select a memory cell of the memory cell array 590 indicated by the address bits.

The address decoder 580 includes the asymmetric transistor 100 discussed with reference to FIG. 1. In some embodiments, the address decoder 580 includes multiple instances of the asymmetric transistor 100. By way of non-limiting example, the memory cell array 590 may include a cross-point memory array (e.g., two-dimensional, three-dimensional), and the address decoder 580 may include an asymmetric transistor 100 for each cross-point.

In some embodiments, the memory cell array 590 includes an array of phase-change memory cells. In some embodiments, the memory cell array includes an array of charge storage memory cells (e.g., capacitors (DRAM), Flash memory cells, ferroelectric memory cells, etc.), other types of memory cells, or combinations thereof.

It should be noted that sometimes the source of transistors of address decoders 580 is operably coupled to a different voltage potential than that of the body of the transistors. As previously discussed, the asymmetric transistor 100 demonstrates improved body effect over symmetric devices. As a result, an address decoder 580 including asymmetric transistors 100 may perform better than address decoders including conventional transistors.

Also, due to voltage differences seen by memory cells at different locations in the memory cell array 590 (e.g., voltage drops over longer traces are larger than voltage drops over shorter traces), different impedances of the transistor 100 are relevant. As previously discussed, a high output resistance (1/gds) and a high transconductance ($G_M$) are desired.

Figure 6:
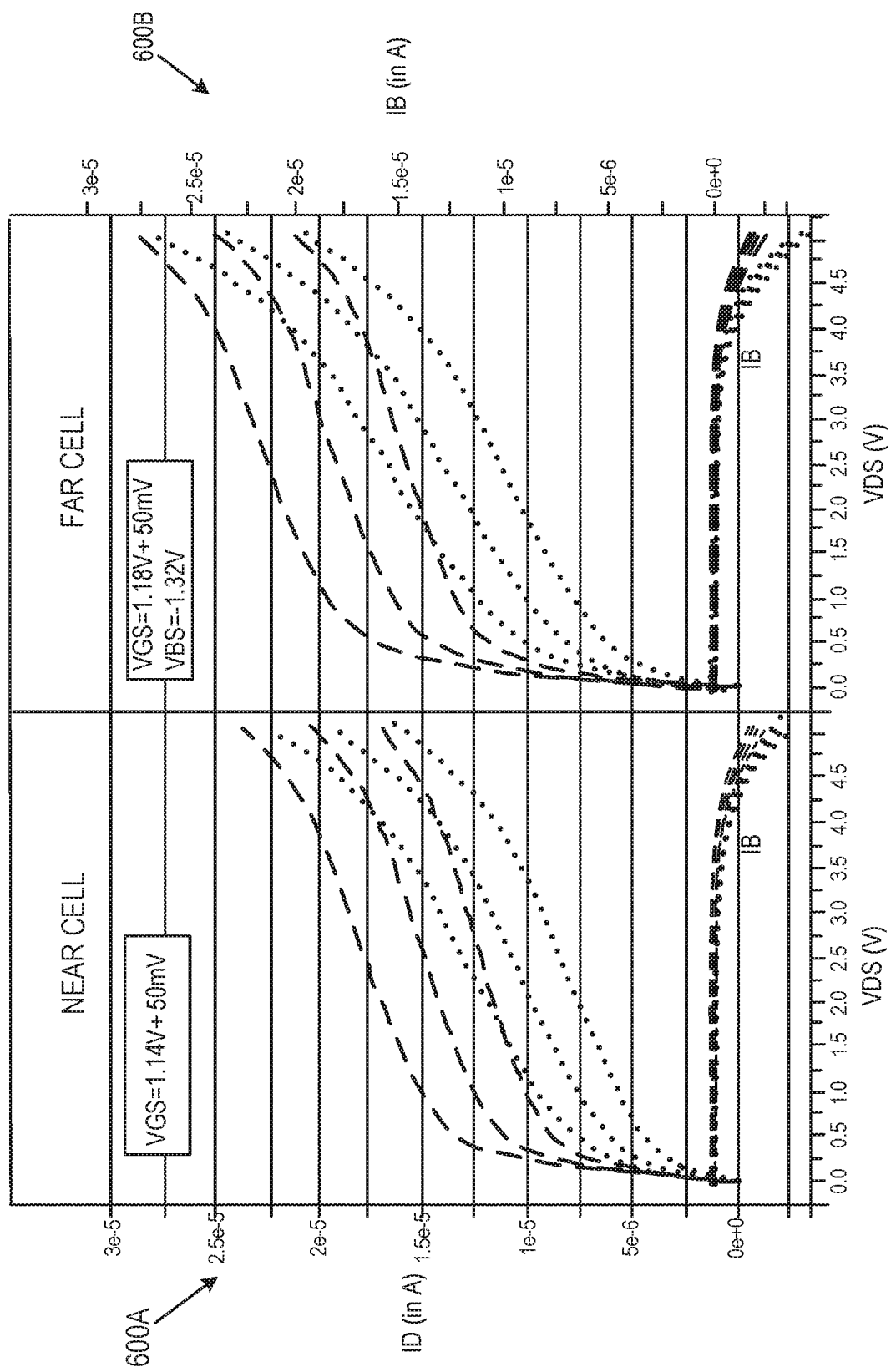
FIG. 6 illustrates simplified plots of drain currents and body currents plotted against drain to source voltages for a near cell and a far cell, respectively, of the memory cell array of FIG. 5.

FIG. 6 illustrates simplified plots 600A, 600B of drain currents ID and body currents IB plotted against drain to source voltages VDS for a near cell and a far cell, respectively, of the memory cell array 590 of FIG. 5. The near cell is a nearest cell to the address decoder 580 and the far cell is a farthest cell from the address decoder 580. Data plotted in the plots 600A, 600B that corresponds to an asymmetric transistor (e.g., the transistor 100 of FIG. 1) is represented in dashed lines. Data plotted in the plots 600A, 600B that corresponds to a symmetric transistor is represented in dotted lines.

As can be seen in FIG. 6, the slopes of drain currents (IDs) for the asymmetric transistor 100 are less than the slopes of IDs for the symmetric transistor for both the near cell and the far cell. Also, a distance between the different ID curves is greater for the asymmetric transistor 100 than for the symmetric transistor (indicating a higher $G_M$ in the asymmetric transistor) for both the near cell and the far cell. As a result, the output impedance of the asymmetric transistor 100 is higher than an output impedance of the symmetric transistor.

For FIG. 6, two biasing conditions were applied to emulate the address decoder 580 (FIG. 5) during selecting the memory cells at the longest and shortest electrical distances. In both cases, the output characteristics are greatly improved for the asymmetric transistor, allowing precise control of the current to access the load line of the threshold switching memory cells.

Figure 7:
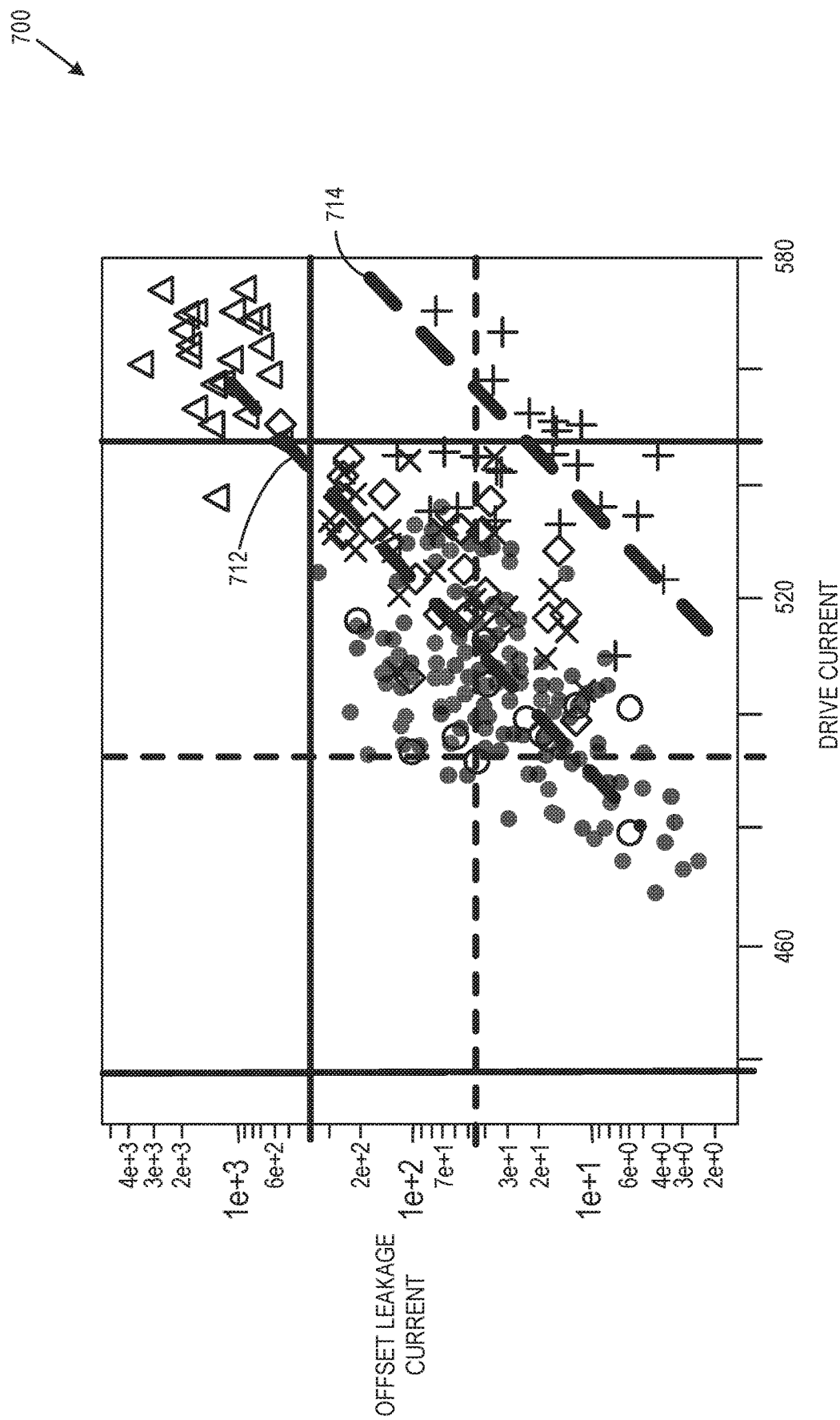
FIG. 7 is a simplified plot of off state leakage currents plotted against drive current for a symmetric transistor and an asymmetric transistor.

FIG. 7 is a simplified plot 700 of off state leakage currents 712, 714 plotted against drive current for a symmetric transistor and an asymmetric transistor (e.g., the transistor 100), respectively. As illustrated in FIG. 7, the asymmetric transistor is capable of generating a lower offset leakage current 714 than an offset leakage current 712 of the symmetric transistor for a given drive current. As a result, the asymmetric transistor can provide higher drive currents than the symmetric transistor without exceeding offset leakage current tolerances. As higher drive currents generally result in faster operating speeds, an address decoder including the asymmetric transistor 100 can operate faster than an address decoder implemented with conventional symmetric transistors. These benefits may result from the abrupt junction and halo doping at the source.

Figure 8:
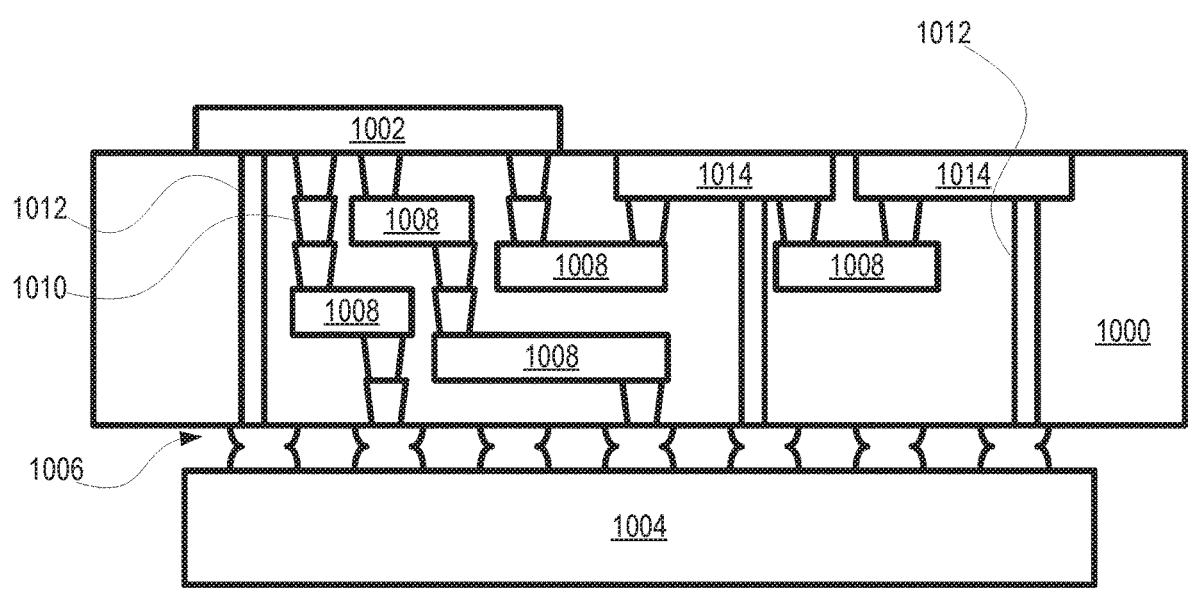
FIG. 8 illustrates an interposer that includes one or more embodiments discussed herein.

FIG. 8 illustrates an interposer 1000 that includes one or more embodiments discussed herein. The interposer 1000 is an intervening substrate used to bridge a first substrate 1002 to a second substrate 1004. The first substrate 1002 may be, for instance, an integrated circuit die. The second substrate 1004 may be, for instance, a memory module, a computer motherboard, or another integrated circuit die. Generally, the purpose of an interposer 1000 is to spread a connection to a wider pitch or to reroute a connection to a different connection. For example, an interposer 1000 may couple an integrated circuit die to a ball grid array (BGA) 1006 that can subsequently be coupled to the second substrate 1004. In some embodiments, the first and second substrates 1002/1004 are attached to opposing sides of the interposer 1000. In other embodiments, the first and second substrates 1002/1004 are attached to the same side of the interposer 1000. And in further embodiments, three or more substrates are interconnected by way of the interposer 1000.

The interposer 1000 may be formed of an epoxy resin, a fiberglass-reinforced epoxy resin, a ceramic material, or a polymer material such as polyimide. In further implementations, the interposer 1000 may be formed of alternate rigid or flexible materials that may include the same materials described above for use in a semiconductor substrate, such as silicon, germanium, and other group III-V and group IV materials.

The interposer 1000 may include metal interconnects 1008 and vias 1010, including but not limited to through-silicon vias (TSVs) 1012. The interposer 1000 may further include embedded devices 1014, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1000.

In accordance with embodiments of the disclosure, apparatuses or processes disclosed herein may be used in the fabrication of interposer 1000.

Figure 9:
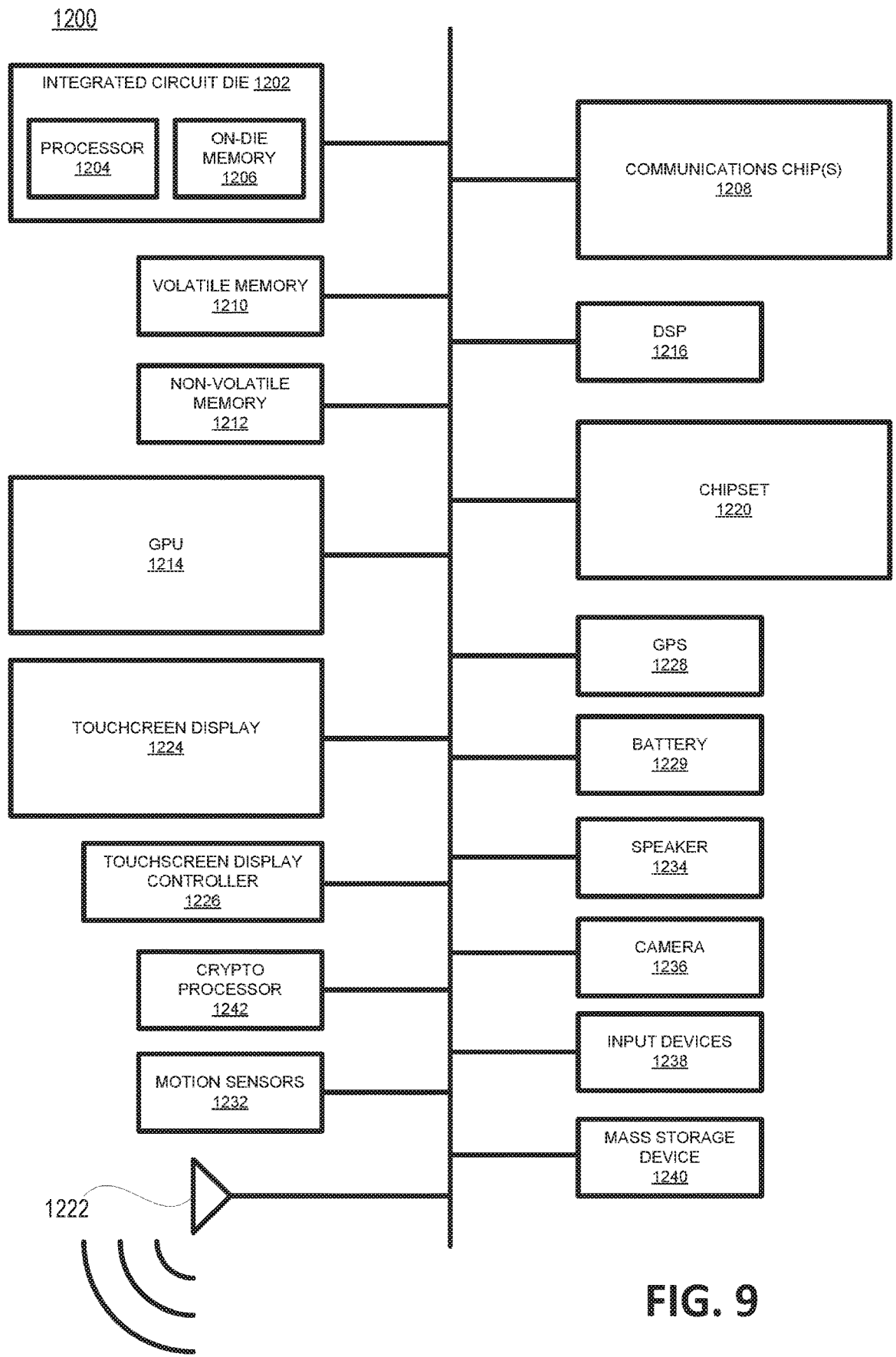
FIG. 9 illustrates a computing device, according to some embodiments.

FIG. 9 illustrates a computing device 1200, according to some embodiments. The computing device 1200 may include a number of components. In one embodiment, these components are attached to one or more motherboards. In an alternate embodiment, some or all of these components are fabricated onto a single system-on-a-chip (SoC) die, such as an SoC used for mobile devices. The components in the computing device 1200 include, but are not limited to, an integrated circuit die 1202 and at least one communications logic unit 1208. In some implementations the communications logic unit 1208 is fabricated within the integrated circuit die 1202 while in other implementations the communications logic unit 1208 is fabricated in a separate integrated circuit chip that may be bonded to a substrate or motherboard that is shared with or electronically coupled to the integrated circuit die 1202. The integrated circuit die 1202 may include a CPU 1204 as well as on-die memory 1206, often used as cache memory, that can be provided by technologies such as embedded DRAM (eDRAM), SRAM, or spin-transfer torque memory (STT-MRAM). These memory devices may include address decoders including asymmetric transistors, as discussed herein.

Computing device 1200 may include other components that may or may not be physically and electrically coupled to the motherboard or fabricated within an SoC die. These other components include, but are not limited to, volatile memory 1210 (e.g., DRAM), non-volatile memory 1212 (e.g., ROM or flash memory, etc.), a graphics processing unit 1214 (GPU), a digital signal processor 1216, a crypto processor 1242 (e.g., a specialized processor that executes cryptographic algorithms within hardware), a chipset 1220, at least one antenna 1222 (in some implementations two or more antenna may be used), a display or a touchscreen display 1224, a touchscreen controller 1226, a battery 1229 or other power source, a power amplifier (not shown), a voltage regulator (not shown), a global positioning system (GPS) device 1228, a compass (not shown), a motion coprocessor or sensors 1232 (that may include an accelerometer, a gyroscope, and a compass), a microphone (not shown), a speaker 1234, a camera 1236, user input devices 1238 (such as a keyboard, mouse, stylus, and touchpad), and a mass storage device 1240 (such as hard disk drive, compact disk (CD), digital versatile disk (DVD), and so forth). The computing device 1200 may incorporate further transmission, telecommunication, or radio functionality not already described herein. In some implementations, the computing device 1200 includes a radio that is used to communicate over a distance by modulating and radiating electromagnetic waves in air or space. In further implementations, the computing device 1200 includes a transmitter and a receiver (or a transceiver) that is used to communicate over a distance by modulating and radiating electromagnetic waves in air or space.

The communications logic unit 1208 enables wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 1208 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, and derivatives thereof, as well as any other wireless protocols that are designated as 3G, 4G, 5G, and beyond. The computing device 1200 may include a plurality of communications logic units 1208. For instance, a first communications logic unit 1208 may be dedicated to shorter range wireless communications such as Wi-Fi, NFC, and Bluetooth and a second communications logic unit 1208 may be dedicated to longer range wireless communications such as GPS, EDGE, GPRS, CDMA, WiMAX, LTE, Ev-DO, and others.

In some embodiments, the processor 1204 of the computing device 1200 includes one or more devices, such as the asymmetric transistor 100, which is formed in accordance with embodiments disclosed herein. The term "processor" may refer to any device or portion of a device that processes electronic data from registers and/or memory to transform that electronic data into other electronic data that may be stored in registers and/or memory.

The communications logic unit 1208 may also include one or more devices, such as asymmetric transistor 100, which is formed in accordance with embodiments disclosed herein.

In further embodiments, another component housed within the computing device 1200 may contain one or more devices, such as the transistor 100, which is are formed in accordance with implementations disclosed herein. By way of non-limiting example, the on-die memory 1206, the volatile memory 1210, the non-volatile memory 1212, the mass storage device 1240, or some other component of the computing device 1200 may include an address decoder 580 (FIG. 5) including the transistor 100. In some embodiments, at least one of the processor 1204, the memory units 1206, 1210, 1212, the GPU 1214, the touchscreen display 1224, the touchscreen display controller 1226, the crypto processor 1242, the motion sensors 1232, the communications chips 1208, the DSP 1216, the chipset 1220, the GPS 1228, the mass storage device 1240, or combinations thereof include an asymmetric transistor 100, as discussed above.

In various embodiments, the computing device 1200 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1200 may be any other electronic device that processes data.

EXAMPLES

The following is a list of example embodiments that fall within the scope of the disclosure. In order to avoid complexity in providing the disclosure, not all of the examples listed below are separately and explicitly disclosed as having been contemplated herein as combinable with all of the others of the examples listed below and other embodiments disclosed hereinabove. Unless one of ordinary skill in the art would understand that these examples listed below, and the above disclosed embodiments, are not combinable, it is contemplated within the scope of the disclosure that such examples and embodiments are combinable.

Example 1

A transistor, comprising: a gate comprising electrically conductive material; and semiconductor material separated from the gate by a gate oxide, the semiconductor material doped with a first type of charge carriers along the gate oxide according to an asymmetric doping profile with a halo region doped with a halo density on a source side of the semiconductor material and a doping density lower than the halo density in a channel region and on a drain side of the semiconductor material, the semiconductor material including: a source comprising a lightly doped drain (LDD) region on the source side, the source doped with a second type of charge carriers with a source density; and a drain doped with the second type of charge carriers on the drain side of the semiconductor material, a drain doping profile of the drain graded from a drain density on the drain side and decreasing past an outer wall of the gate toward the source side along the gate oxide.

Example 2

The transistor of Example 1, wherein the first type of charge carriers comprises electron holes and the second type of charge carriers comprises electrons.

Example 3

The transistor of Example 1, wherein the first type of charge carriers comprises electrons and the second type of charge carriers comprises electron holes.

Example 4

The transistor according to any one of Examples 1-3, wherein the drain comprises a large angle tilt implant drain (LATID).

Example 5

The transistor according to any one of Examples 1-4, wherein the source is operably coupled to a first electrical line configured to operate at a voltage potential that is different from a voltage potential of a second electrical line operably coupled to a body of the transistor.

Example 6

The transistor according to any one of Examples 1-5, wherein the halo region and the LDD region together form an abrupt junction that is resilient to short channel effects.

Example 7

The transistor according to any one of Examples 1-6, wherein the drain density is lower than the source density.

Example 8

A method of manufacturing a semiconductor device, the method comprising: applying a large angle tilt implant drain (LATID) process to semiconductor material on a drain side of a transistor gate to produce a drain; applying a halo implant process to the semiconductor material on a source side of the transistor gate to form a source side halo; and applying a lightly doped drain (LDD) process to the source side of the semiconductor material to form a source.

Example 9

The method of Example 8, wherein applying a LATID process to semiconductor material on a drain side comprises applying a high-angle LATID process to the semiconductor material on the drain side.

Example 10

The method of Example 9, wherein applying a high-angle LATID process to the semiconductor material on the drain side comprises applying a LATID process having an angle of between thirty degrees (30%) and forty degrees (40%) to the semiconductor material on the drain side.

Example 11

The method according to any one of Examples 8-10, wherein applying a LATID process to semiconductor material on a drain side comprises applying the LATID process using an n-type dopant.

Example 12

The method of Example 11, wherein applying the LATID process includes using a P31 n-type dopant.

Example 13

The method according to any one of Examples 8-12, further comprising: disposing a gate oxide on the semiconductor material; disposing a gate material on the gate oxide; and etching the gate material to form the transistor gate.

Example 14

A memory device, comprising: an array of memory cells; and at least one address decoder operably coupled to the array of memory cells, the at least one address decoder including at least one transistor, the at least one transistor comprising: a source including low density drain (LDD) implants; a drain including large angle tilt drain (LATID) implants; and a channel region having an asymmetric doping profile with a higher doping density proximate to the source than a doping density of the channel region near the drain.

Example 15

The memory device of Example 14, wherein the array of memory cells comprises a three-dimensional cross-point memory array.

Example 16

The memory device according to any one of Examples 14 and 15, wherein the array of memory cells comprises an array of phase-change memory cells.

Example 17

The memory device according to any one of Examples 14 and 15, wherein the array of memory cells comprises an array of charge storage memory cells.

Example 18

A computing device comprising: an asymmetric transistor including: a drain; a source; and an asymmetrically doped channel region between the drain and the source, the asymmetrically doped channel region including: a source side, at least a portion of the source side doped with a higher doping concentration than the remainder of the asymmetrically doped channel region, the at least a portion of the source side forming an abrupt junction with the source; a drain side demonstrating a graded doping profile resulting from a LATID implant process used to form the drain.

Example 19

The computing device of Example 18, further comprising: a processor mounted on a substrate; a memory unit capable of storing data; a graphics processing unit; an antenna within the computing device; a display on the computing device; a battery within the computing device; a power amplifier within the processor; and a voltage regulator within the processor; wherein at least one of the processor, the memory unit, the graphics processing unit, or the display includes the asymmetric transistor.

Example 20

The computing device of Example 18, wherein the computing device comprises a memory device including an address decoder, the address decoder comprising the asymmetric transistor.

Example 21

A method of forming a transistor, the method comprising: forming a gate comprising electrically conductive material on a gate oxide separating the gate from a semiconductor material; doping the semiconductor material with a first type of charge carriers according to an asymmetric doping profile along the gate oxide with a halo region doped with a halo density on a source side of the semiconductor material and a doping density lower than the halo density in a channel region and on a drain side of the semiconductor material; the semiconductor material including: doping the semiconductor material with a source comprising a lightly doped drain (LDD) region on the source side, the source doped with a second type of charge carriers with a source density; and doping the semiconductor material with a drain doped with the second type of charge carriers on the drain side of the semiconductor material, a drain doping profile of the drain graded from a drain density on the drain side and decreasing past an outer wall of the gate toward the source side along the gate oxide.

Example 22

The method of Example 21, wherein doping the semiconductor material with a first type of charge carriers and doping the semiconductor material with a second type of charge carriers comprises doping the semiconductor material with electron holes and doping the semiconductor material with electrons, respectively.

Example 23

The method of Example 21, wherein doping the semiconductor material with a first type of charge carriers and doping the semiconductor material with a second type of charge carriers comprises doping the semiconductor material with electrons and doping the semiconductor material with electron holes, respectively.

Example 24

The method according to any one of Examples 21-23, wherein doping the semiconductor material with a drain comprises doping the semiconductor material with a large angle tilt implant drain (LATID).

Example 25

The method according to any one of Examples 21-24, further comprising operably coupling the source to a first electrical line configured to operate at a voltage potential that is different from a voltage potential of a second electrical line operably coupled to a body of the transistor.

Example 26

The method according to any one of Examples 21-25, wherein doping the semiconductor material with the halo region and the LDD region comprises forming an abrupt junction between the halo region and the LDD region that is resilient to short channel effects.

Example 27

The method according to any one of Examples 21-26, wherein doping the semiconductor material with the drain comprises doping the drain with the drain density that is lower than the source density.

Example 28

A semiconductor device, comprising: a drain including a large angle tilt implant drain (LATID) region in a semiconductor material on a drain side of a transistor gate; a halo implant in the semiconductor material on a source side of the transistor gate; and a source including a lightly doped drain (LDD) on the source side of the semiconductor material.

Example 29

The semiconductor device of Example 28, wherein the LATID region includes a high-angle LATID region formed by applying a high-angle LATID process to the semiconductor material on the drain side.

Example 30

The semiconductor device of Example 29, wherein the high angle LATID region is formed by applying a LATID process having an angle of between thirty degrees (30%) and forty degrees (40%) to the semiconductor material on the drain side.

Example 31

The semiconductor device according to any one of Examples 28-30, wherein the LATID region includes an n-type dopant.

Example 32

The semiconductor device of Example 31, wherein the LATID region includes a P31 n-type dopant.

Example 33

The semiconductor device according to any one of Examples 28-32, further comprising a gate oxide on the semiconductor material, and the transistor gate comprising a gate material on the gate oxide.

Example 34

A method of operating memory device, the method comprising: performing memory operations on an array of memory cells; and decoding addresses of the memory cells with at least one address decoder operably coupled to the array of memory cells, the at least one address decoder including at least one transistor, wherein decoding addresses of the memory cells comprises biasing a gate of the at least one transistor to: control a channel region of the at least one transistor, the channel region having an asymmetric doping profile with a higher doping density proximate to a source of the at least one transistor than a doping density of the channel region near a drain of the at least one transistor; and control current flow between the source and the drain, the source including low density drain (LDD) implants, and the drain including large angle tilt drain (LATID) implants.

Example 35

The method of Example 34, wherein performing memory operations on an array of memory cells comprises performing the memory operations on a three dimensional cross-point memory array.

Example 36

The method according to any one of Examples 34 and 35, wherein performing memory operations on an array of memory cells comprises performing the memory operations on an array of phase-change memory cells.

Example 37

The method according to any one of Examples 34 and 35, wherein performing memory operations on an array of memory cells comprises performing the memory operations on an array of charge storage memory cells.

Example 38

A method of providing a computing device, the method comprising: forming an asymmetric transistor including a drain and a source; and doping a channel region between the drain and the source asymmetrically by: doping a source side of the channel region with at least a portion of the source side doped with a higher doping concentration than the remainder of the asymmetrically doped channel region, the at least a portion of the source side forming an abrupt junction with the source; and doping a drain side of the channel region with the drain side demonstrating a graded doping profile resulting from a LATID implant process used to form the drain.

Example 39

The method of Example 38, further comprising: providing a processor mounted on a substrate; providing a memory unit capable of storing data; providing a graphics processing unit; providing an antenna within the computing device; providing a display on the computing device; providing a battery within the computing device; providing a power amplifier within the processor; and providing a voltage regulator within the processor; wherein providing the processor, the memory unit, the graphics processing unit, and the display includes providing at least one of the processor, the memory unit, the graphics processing unit, or the display with the asymmetric transistor incorporated therein.

Example 40

The method of Example 38, further comprising providing a memory device of the computing device, the memory device including an address decoder, the address decoder comprising the asymmetric transistor.

Example 41

A non-transitory computer-readable storage medium comprising computer-readable instructions stored thereon, the computer-readable instructions configured to instruct a processor to perform at least a portion of the method according to any one of Examples 8-13, 21-27, and 34-40.

Example 42

A means for performing at least a portion of the method according to any one of Examples 8-13, 21-27, and 34-40.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A transistor, comprising;
a gate comprising electrically conductive material; and
semiconductor material separated from the gate by a gate oxide, the semiconductor material doped with a first type of charge carriers along the gate oxide according to an asymmetric doping profile with a halo region doped with a halo density on a source side of the semiconductor material and a doping density lower than the halo density in a channel region and on a drain side of the semiconductor material, the semiconductor material including:
a source comprising a lightly doped drain (LDD) region on the source side, the source doped with a second type of charge carriers with a source density; and
a drain doped with the second type of charge carriers on the drain side of the semiconductor material, a drain doping profile of the drain graded from a drain density on the drain side and decreasing past an outer wall of the gate toward the source side along the gate oxide.

2. The transistor of claim 1, wherein the first type of charge carriers comprises electron holes and the second type of charge carriers comprises electrons.

3. The transistor of claim 1, wherein the first type of charge carriers comprises electrons and the second type of charge carriers comprises electron holes.

4. The transistor of claim 1, wherein the drain comprises a large angle tilt implant drain (LATID).

5. The transistor of claim 1, wherein the source is operably coupled to a first electrical line configured to operate at a voltage potential that is different from a voltage potential of a second electrical line operably coupled to a body of the transistor.

6. The transistor of claim 1, wherein the halo region and the LDD region together form an abrupt junction that is resilient to short channel effects.

7. The transistor of claim 1, wherein the drain density is lower than the source density.

* * * * *